United States Patent
Cheng et al.

(10) Patent No.: US 10,367,020 B2
(45) Date of Patent: Jul. 30, 2019

(54) POLARIZERS FOR IMAGE SENSOR DEVICES

(71) Applicant: Taiwan Semiconductor Manufacturing Co., Ltd., Hsinchu (TW)

(72) Inventors: Yun-Wei Cheng, Taipei (TW); Chun-Hao Chou, Tainan (TW); Kuo-Cheng Lee, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/964,288

(22) Filed: Apr. 27, 2018

(65) Prior Publication Data

US 2019/0148437 A1    May 16, 2019

Related U.S. Application Data

(60) Provisional application No. 62/586,277, filed on Nov. 15, 2017.

(51) Int. Cl.
 *G02B 5/30* (2006.01)
 *H01L 27/146* (2006.01)

(52) U.S. Cl.
 CPC ...... *H01L 27/14625* (2013.01); *G02B 5/3008* (2013.01); *G02B 5/3058* (2013.01); *H01L 27/1464* (2013.01); *H01L 27/14621* (2013.01)

(58) Field of Classification Search
 None
 See application file for complete search history.

(56) References Cited

U.S. PATENT DOCUMENTS

| 9,105,774 | B2 * | 8/2015 | Ooka | H01L 27/14625 |
| 2010/0253820 | A1 * | 10/2010 | Kanamori | H01L 27/14621 |
| | | | | 348/280 |
| 2018/0302597 | A1 * | 10/2018 | Honda | G02B 5/20 |

OTHER PUBLICATIONS

Anzagira, Leo, and Eric R. Fossum. "Application of the Quanta Image Sensor Concept to Linear Polarization Imaging—a Theoretical Study." Journal of the Optical Society of America A, vol. 33, No. 6, 2016, p. 1147., doi:10.1364/josaa.33.001147.*
Sasagawa, Kiyotaka, et al. "Image Sensor Pixel with on-Chip High Extinction Ratio Polarizer Based on 65-Nm Standard CMOS Technology." Optics Express, vol. 21, No. 9, 2013, p. 11132., doi:10.1364/oe.21.011132.*

* cited by examiner

Primary Examiner — J. E. Schoenholtz
(74) *Attorney, Agent, or Firm* — Sterne, Kessler, Goldstein & Fox P.L.L.C.

(57) ABSTRACT

The present disclosure is directed to a method of forming a polarization grating structure (e.g., polarizer) as part of a grid structure of a back side illuminated image sensor device. For example, the method includes forming a layer stack over a semiconductor layer with radiation-sensing regions. Further, the method includes forming grating elements of one or more polarization grating structures within a grid structure, where forming the grating elements includes (i) etching the layer stack to form the grid structure and (ii) etching the layer stack to form grating elements oriented to a polarization angle.

20 Claims, 13 Drawing Sheets

POLARIZERS FOR IMAGE SENSOR DEVICES

CROSS-REFERENCE TO RELATED APPLICATION

This application claims the benefit of U.S. Provisional Patent Application No. 62/586,277, titled "Polarizers for Image Sensor Devices," which was filed on Nov. 15, 2017 and is incorporated herein by reference in its entirety.

BACKGROUND

Semiconductor image sensors are used to sense radiation, such as light. Complementary metal-oxide-semiconductor (CMOS) image sensors (CIS) and charge-coupled device (CCD) sensors are used in various applications such as digital still camera or mobile phone camera applications. These devices utilize an array of pixels (which can include photodiodes, transistors, and other components) in a substrate to absorb (e.g., sense) radiation that is projected toward the substrate and convert the sensed radiation into electrical signals. A back side illuminated image sensor device is one type of image sensor device that can detect light from the back side.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
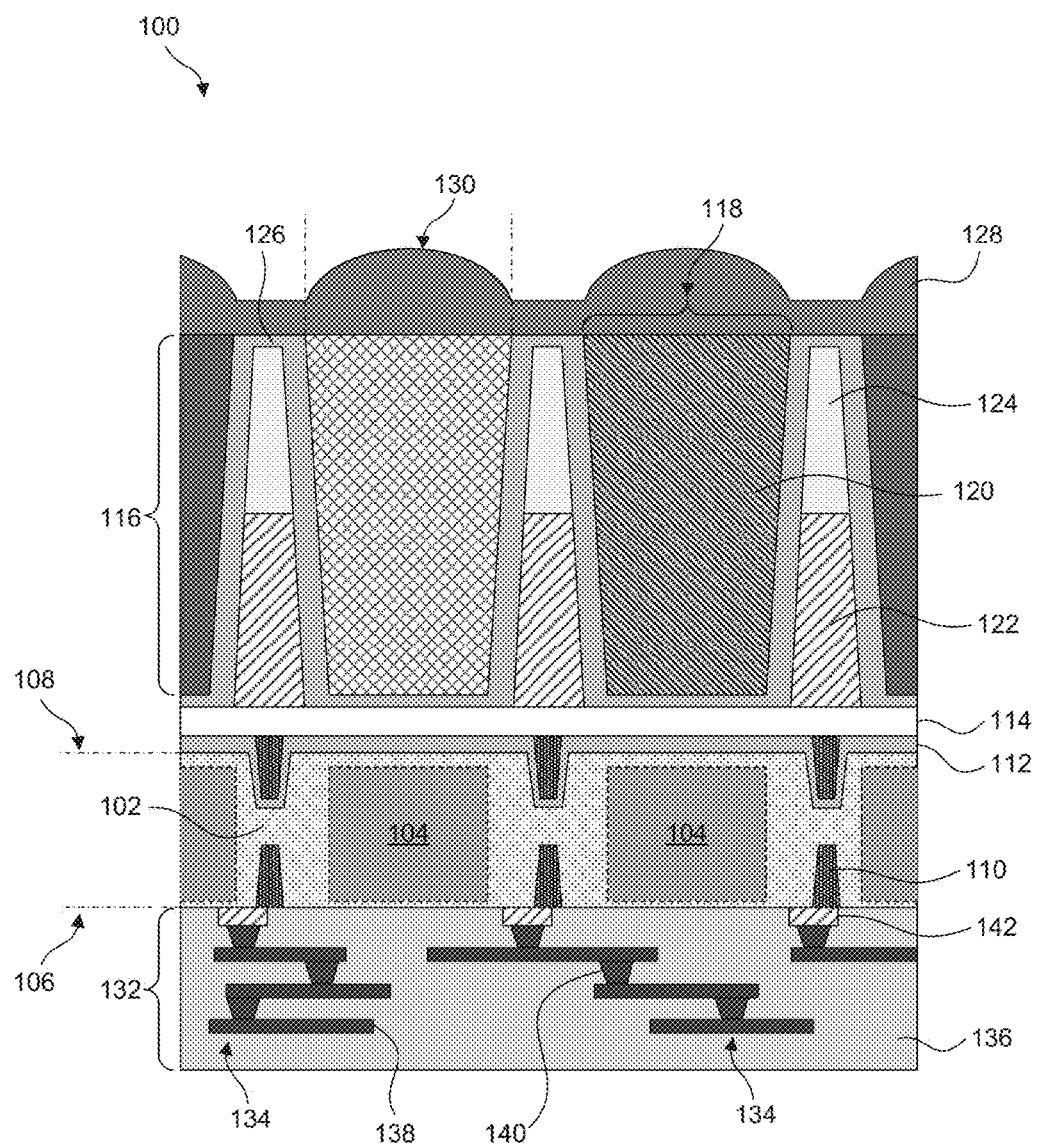
FIG. 1 is a cross-sectional view of a backside illuminated image sensor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity varies by ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Semiconductor image sensor devices are used to sense electromagnetic radiation, such as light (e.g., visible light). Complementary metal-oxide-semiconductor (CMOS) image sensors (CIS) and charge-coupled device (CCD) sensors can be used in various applications, such as digital still camera or mobile phone camera applications. These devices utilize an array of pixels (which can include photodiodes, transistors, and other components) in a substrate to absorb (e.g., sense) radiation that is projected toward the substrate. The absorbed radiation can be converted by the photodiodes (in the pixel) into electrical signals, such as charge or current, that can be further analyzed and/or processed by other modules of the image sensor device.

One type of image sensor device is a back side illuminated image sensor device. In a back side illuminated image sensor device, color filters and micro-lenses are positioned on the back side of a substrate (e.g., on an opposite side of the substrate's circuitry), so that the image sensor device can collect light with minimal or no obstructions. As a result, back side illuminated image sensor devices are configured to detect light from the back side of the substrate, rather than from a front side of the substrate where the color filters and micro-lenses of the image sensor device are positioned between the substrate's circuitry and the photodiodes. Compared to front side illuminated image sensor devices, back side illuminated image sensor devices have improved performance under low light conditions and higher quantum efficiency (QE) (e.g., photon to electron conversion percentage).

Image sensor devices use color filters to capture color information from incident light rays. For example, the image sensor devices-through the use of color filters—can detect the red, green, and blue (RGB) regions of the visible light spectrum. A composite grid structure, which can be filled with color filter material, can be used to position the color filter material above photodiodes of the image sensor device. The composite grid structure can be made in part from an oxide or another dielectric material which is transparent to visible light.

Further, the image sensor can also be equipped with external polarizers in order to collect polarization information from incident light. Polarization information can be used in applications such as photography and filming. However, since the polarizers are external and not integrated to the composite grid structure, a distance between the polarizers and the image sensor can be substantial—e.g., relative to the size of the back side illuminated image sensor device. This configuration can impact the final product's size and can restrict size reduction efforts. Further, in order to obtain information on different polarization conditions, the external polarizer can rotate, or spin, which can impact polarization data acquisition time.

Various embodiments in accordance with this disclosure provide a method to integrate one or more polarizers in a composite grid structure of a back side illuminated image sensor device. In some embodiments, the polarizers are integrated into the composite grid structure by replacing one or more color filters of the composite grid structure with a polarizing grating structure (grid polarizer) within the composite grid structure. In some examples, the polarizing grating structure can provide polarization information for incident light along the following polarization angles: 0°, 45°, 90°, and/or 135°. However, these directions are not limiting and other polarization angles are possible. According to some embodiments, the pitch between the elements (grating elements) of the polarizing grating structure can range from about 100 nanometers (nm) to about 500 nm (e.g., from 100 nm to 500 nm), and the width of each grating element can range from about 20 nm to about 300 nm (e.g., from 20 nm to 300 nm). The aforementioned ranges are optimized based on the wavelength of the incident light. In some embodiments, the grating elements of the polarizing grating structure include a same material as the composite grid structure. In some embodiments, the grating elements of the polarizing grating structure include a different material from the composite grid structure.

FIG. 1 is a simplified cross-sectional view of a back side illuminated image sensor device 100, according to some embodiments of the present disclosure. Back side illuminated image sensor device 100 includes a semiconductor layer 102 with radiation-sensing areas 104. Semiconductor layer 102 can include a silicon material doped with a p-type dopant, such as boron. Alternatively, semiconductor layer 102 can include silicon doped with an n-type dopant, such as phosphorous or arsenic. Semiconductor layer 102 can also include other elementary semiconductors, such as germanium or diamond. Semiconductor layer 102 can optionally include a compound semiconductor and/or an alloy semiconductor. Further, semiconductor layer 102 can include an epitaxial layer, which may be strained for performance enhancement. Semiconductor layer 102 can include a silicon-on-insulator (SOI) structure.

Semiconductor layer 102 has a front side (also referred to herein as a "bottom surface") 106 and a back side (also referred to herein as a "top surface") 108. Semiconductor layer 102 has a thickness that can range from about 100 μm to about 3000 μm (e.g., from 100 μm to 3000 μm).

Radiation-sensing regions 104 are formed in semiconductor layer 102. Radiation-sensing regions 104 are configured to sense radiation, such as incident light rays impinging semiconductor layer 102 from back side 108. Each of the radiation-sensing regions or radiation-sensing regions 104 include a photodiode that can convert photons to charge, according to some embodiments of the present disclosure. In some embodiments of the present disclosure, radiation-sensing regions 104 can include photodiodes, transistors, amplifiers, other similar devices, or combinations thereof. Radiation-sensing regions 104 may also be referred to herein as "radiation-detection devices" or "light-sensors."

For simplicity, two radiation-sensing regions 104 are illustrated in FIG. 1, but additional radiation-sensing regions 104 can be implemented in semiconductor layer 102. By way of example and not limitation, radiation-sensing regions 104 can be formed using an ion implant process on semiconductor layer 102 from front side 106. Radiation-sensing regions 104 can also be formed by a dopant diffusion process.

Radiation-sensing regions 104 are electrically isolated from each other with isolation structures 110. Isolation structures 110 can be trenches etched into semiconductor layer 102 and filled with a dielectric material, such as silicon oxide, silicon nitride, silicon oxynitride, fluorine-doped silicate glass (FSG), a low-k dielectric material (e.g., a material with a k value lower than 3.9), and/or a suitable insulating material. According to some embodiments of the present disclosure, isolation structures 110 on back side 108 of semiconductor layer 102 have an anti-reflective coating (ARC) 112. ARC 112 is a liner layer that can prevent incoming light rays from being reflected away from radiation-sensing areas/pixels 104. ARC 112 can include a high-k material (e.g., a material with a k-value higher than 3.9), such as hafnium oxide ($HfD_2$), tantalum pentoxide ($Ta_2O_5$), zirconium dioxide ($ZrO_2$), aluminum oxide ($Al_2O_3$), or any other high-k material. ARC 112 can be deposited using a sputtering process, a chemical vapor deposition (CVD)-based process, an atomic layer deposition (ALD)-based techniques, or any other suitable deposition technique. In some embodiments of the present disclosure, the thickness of ARC 112 can range from about 10 Å to about 500 Å (e.g., from 10 Å to 500 Å).

Back side illuminated image sensor device 100 also includes a capping layer 114 formed over semiconductor layer 102, such as over ARC 112, as illustrated in FIG. 1. In some embodiments of the present disclosure, capping layer 114 can provide a planar surface on which additional layers of back side illuminated image sensor device 100 can be formed. Capping layer 114 can include a dielectric material, such as silicon oxide ($SiO_2$), silicon nitride ($Si_3N_4$), silicon oxy-nitride (SiON), or any other suitable dielectric material. Further, capping layer 114 can be deposited using CVD or any other suitable deposition technique. In some embodiments of the present disclosure, the thickness of capping layer 114 can range between about 500 Å and about 2000 Å (e.g., from 500 Å to 2000 Å).

Further, back side illuminated image sensor device 100 includes a composite grid structure 116 formed over capping layer 114. According to some embodiments of the present disclosure, composite grid structure 116 includes cells 118 arranged in columns and rows, where each cell 118 is aligned to a respective radiation-sensing area 104. As mentioned above, cells 118 can receive a red, green, or blue color filter 120.

Figure 2:
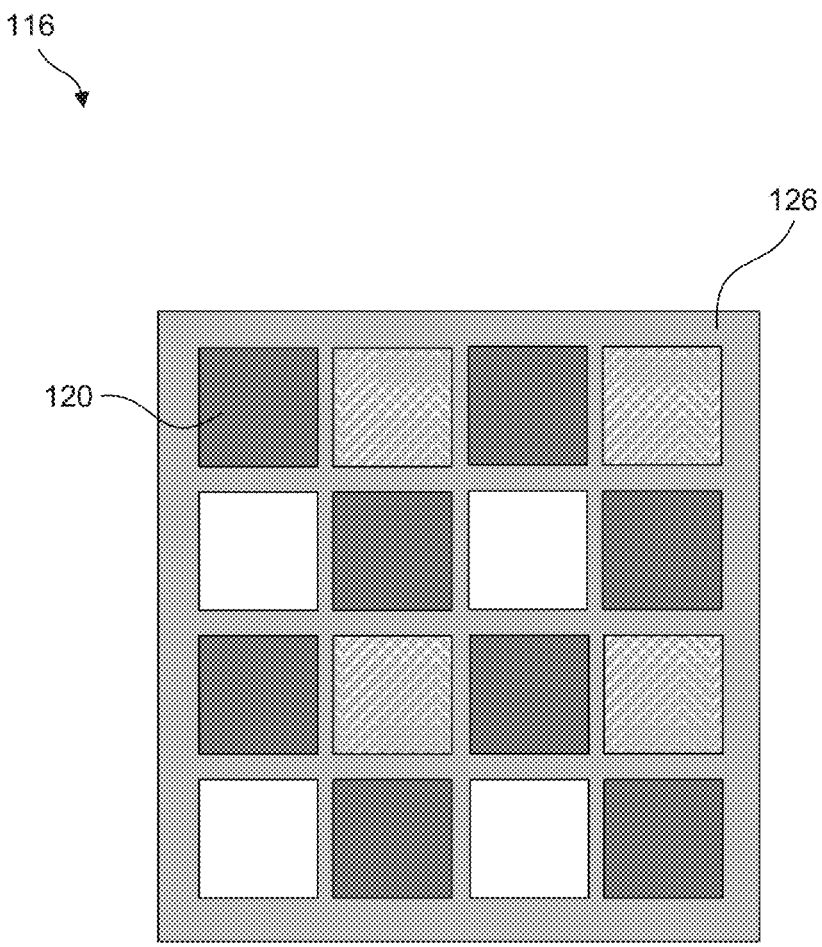
FIG. 2 is a top view of a composite grid structure with color filters, according to some embodiments.

FIG. 2 is a top view of composite grid structure 116, according to some embodiments. The arrangement of color filters 120 in composite grid structure 116 can be based on a Bayer pattern. For example, composite grid structure 116 can include 50% green color filters, 25% red color filters and 25% blue color filters, where every other cell 118 of composite grid structure 116 is filled with a different color filter 120. However, this is not limiting and neighboring cells 118 can be occupied (e.g., filled) by the same-color color filter.

Referring to FIG. 1, cells 118 of composite grid structure 116 can be formed by depositing a bottom layer 122 and a top dielectric layer 124 and selectively etching away portions of the bottom layer and top dielectric layer to form cells 118. By way of example and not limitation, composite grid structure 116 can be formed as follows: bottom layer 122 and top dielectric layer 124 can be blanket deposited on capping layer 114; and one or more photolithography and etch operations can be used to pattern bottom layer 122 and top dielectric layer 124 to form the sidewalls of cells 118. The photolithography and etch operations can be performed so that each cell 118 of composite grid structure 116 is aligned to respective radiation-sensing regions 104 of semiconductor layer 102. In some embodiments, the sidewall height of each cell 118 of composite grid structure 116 can range from about 200 nm to about 1000 nm (e.g., from 200 nm to 1000 nm).

Bottom layer 122 of cell 118 can be made of titanium, tungsten, aluminum, or copper. However, bottom layer 122 of cells 118 may not be limited to metals and may include other suitable materials or stack of materials that can reflect and guide incoming visible light towards radiation-sensing areas 104. In some embodiments of the present disclosure, bottom layer 122 of cells 118 is formed using a sputtering process, a plating process, an evaporation process, or any other suitable deposition method. According to some embodiments of the present disclosure, the thickness of bottom layer 122 of each cell 118 can range from about 100 Å to about 3000 Å (e.g., from 100 Å to 3000 Å).

Top dielectric layer 124 can include one or more dielectric layers. In some embodiments, top dielectric layer 124 can protect previously-formed layers of back side illuminated image sensor device 100 (e.g., bottom layer 122 and capping layer 114). Top dielectric layer 124 can allow incoming light to pass through and reach radiation-sensitive areas 104. Top dielectric layer 124 can be made of a transparent material or materials. In some embodiments of the present disclosure, top dielectric layer 124 can include $SiO_2$, $Si_3N_4$, SiON, or any other suitable transparent dielectric material. Top dielectric layer 124 can be deposited by CVD or ALD and can have a deposited thickness range from about 1000 Å to about 3000 Å (e.g., from 1000 Å to 3000 Å), according to some embodiments. In some embodiments, composite grid structure 116 includes more than two layers, such as a first layer of tungsten, a second layer of plasma-enhanced oxide (PEOX) over the first layer, and a third layer of silicon oxynitride over the second layer.

Cells 118 also include a passivation layer 126, which is interposed between color filter 120 and the sidewalls materials of cells 118 (e.g., bottom layer 122 and top dielectric layer 124). By way of example and not limitation, passivation layer 126 can be conformally deposited by a CVD-based or an ALD-based deposition technique. Passivation layer 126 can be formed from a dielectric material, such as $SiO_2$, $Si_3N_4$, or SiON, and can have a thickness between about 50 Å to about 3000 Å (e.g., from 50 Å to 3000 Å).

According to some embodiments, the top surface of color filters 120 can be aligned to the top surface of passivation layer 126 on top dielectric layer 124. Alternatively, color filters 120 can be over the top surface of passivation layer 126 on top dielectric layer 124. For example and explanation purposes, the top surface of color filters 120 will be described as being aligned to the top surface of passivation layer 126 on top dielectric layer 124.

After cells 118 of composite grid structure 116 receive their respective color filters 120, a transparent material layer 128 can be formed over composite grid structure 116 and color filters 120. Transparent material layer 128 can be in contact with passivation layer 126 if the top surface of color filters 120 is aligned to the top surface of passivation layer 126 over top dielectric layer 124, according to some embodiments. Alternatively, in some embodiments, transparent material layer 128 may not be in contact with passivation layer 126 if the top surface of color filters 120 is above the top surface of passivation layer 126 over top dielectric layer 124. In some examples, transparent material layer 128 forms a micro-lens 130 over each cell 118 of composite grid structure 116. Micro-lenses 130 are aligned with respective radiation-sensing areas 104 and are formed so they cover the top surface of color filters 120 within the boundaries of cell 118 (e.g., within the sidewalls of each cell 118).

Micro-lenses 130, due to their curvature, are thicker than other areas of transparent material layer 128 (e.g., areas between micro-lenses 130 above top dielectric layer 124). For example, transparent material layer 128 is thicker over color filter 120 (e.g., where micro-lens 130 are formed) and thinner in areas between micro-lenses 130 (e.g., above top dielectric layer 124)

Referring to FIG. 1, back side illuminated image sensor device 100 can also include an interconnect structure 132. Interconnect structure 132 can include patterned dielectric layers and conductive layers that form interconnects (e.g., wiring) between radiation-sensing regions 104 and other components (not shown in FIG. 1). Interconnect structure 132 may be, for example, one or more multilayer interconnect (MLI) structures 134 embedded in an interlayer dielectric (ILD) layer 136. According to some embodiments of the present disclosure, MLI structures 134 can include contacts/vias and metal lines. For purposes of illustration, multiple conductive lines 138 and vias/contacts 140 are shown in FIG. 1. The position and configuration of conductive lines 138 and vias/contacts 140 can vary depending on design and are not limited to the depiction of FIG. 1. Further, interconnect structure 132 can include sensing devices 142. Sensing devices 142 can be, for example, an array of field effect transistors (FETs) and/or memory cells that are electrically connected to respective radiation-sensing areas (or pixels) 104 and configured to read an electrical signal produced in those areas as a result of a light-to-charge conversion process.

In some embodiments of the present disclosure, interconnect structure 132 can be a top layer of a partially-fabricated integrated circuit (IC) or of a fully-fabricated IC that can include multiple layers of interconnects, resistors, transistors, and/or other semiconductor devices. As a result, interconnect structure 132 can include front end of the line (FEOL) and middle of the line (MOL) layers. Furthermore, interconnect structure 132 can be attached via a buffer layer (not shown in FIG. 1) to a carrier substrate (not shown in FIG. 1) that can provide support to the structures fabricated thereon (e.g., interconnect layer 132, semiconductor layer 102, etc.). The carrier substrate can be, for example, a silicon wafer, a glass substrate, or any other suitable material.

In some embodiments of the present disclosure, fabrication of back side illuminated image sensor device 100 can include forming semiconductor layer 102 on a silicon substrate (e.g., silicon wafer) and subsequently forming interconnect structure 132 over front side 106 of semiconductor layer 102. Interconnect structure 132 can undergo multiple photolithography, etch, deposition, and planarization operations before it is completed. Once interconnect structure 132 is formed, a carrier substrate (as discussed above) can be attached to the top of interconnect structure 132. For example, a buffer layer can act as an adhesion medium between the carrier substrate and interconnect structure 132. The silicon substrate can be turned upside down, and the silicon substrate can be mechanically grinded and polished until back side 108 of semiconductor layer 102 is exposed. The isolation structures on back side 108 of semiconductor layer 102 can be subsequently formed to further electrically isolate radiation-sensing areas or pixels 104. Capping layer 114, along with the composite grid structure 116, can be formed on back side 108 of semiconductor layer 102.

Composite grid structure 116 can be formed so that each of its cells 118 is aligned to respective radiation-sensing areas or pixels 104. Alignment of composite grid structure 116 and radiation-sensing areas, or pixels, 104 can be achieved with photolithographic operations based on, for example, alignment marks present on back side 108 of semiconductor layer 102. The formation of composite grid structure 116 can include the deposition and subsequent patterning of bottom layer 122 and top dielectric layer 124 using photolithography and etch operations to form cells 118. Passivation layer 126 is subsequently deposited over the exposed surfaces of bottom layer 122 and top dielectric layer 124. Color filters 120 can fill cells 118, and transparent material layer 128 can be deposited thereon to form microlenses 130. Fabrication of back side illuminated image sensor device 100 is not limited to the operations described above and additional or alternative operations can be performed.

Figure 3:
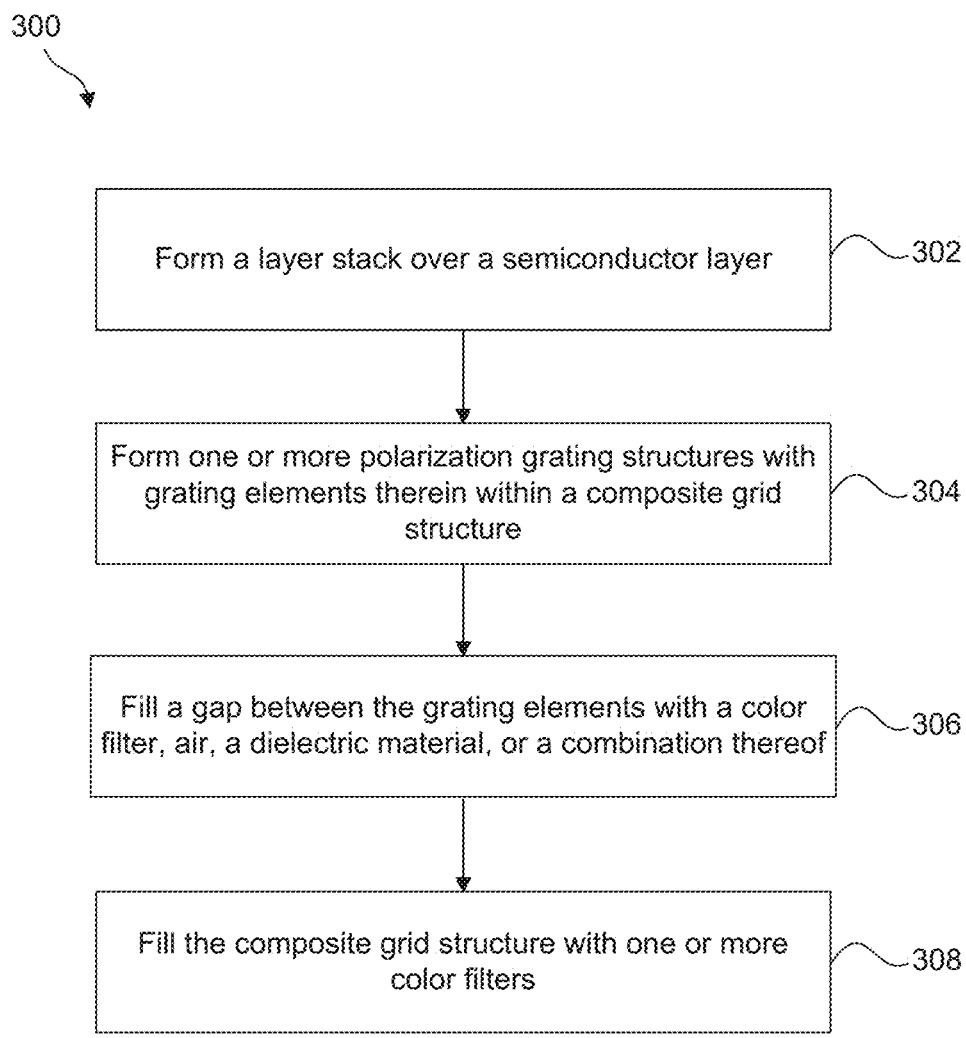
FIG. 3 is a flow chart of a method for forming a polarization grating structure in a composite grid structure of a backside illuminated image sensor device, according to some embodiments.

According to some embodiments, FIG. 3 is a flow chart of a method 300 for forming one or more polarizing grating structures (grid polarizers) within the composite grid structure of an image sensor. For example purposes, method 300 will be described in the context of back side illuminated image sensor device 100 of FIG. 1. The polarizing grating structure can have any of the following polarization directions: 0°, 45°, 90°, or 135°. However, these directions are not limiting and other polarization directions are possible. Method 300 is not limited to back side illuminated image sensor devices and may be extended to other types of image sensor devices, such as front side illuminated image sensor devices, that share similar material layers and/or geometries. These other types of image sensor devices are within the spirit and scope of the present disclosure.

According to some embodiments, method 300 can form grating elements in cells 118 of composite grid structure 116. The grating elements can be oriented towards a polarization angle that can range from 0° to 135° at increments of 45° (e.g., 0°, 45°, 90°, and 135°). Method 300 is not limited to the operations described below. Other fabrication operations can be performed between the various operations of method 300 and are omitted merely for clarity.

Figure 4:
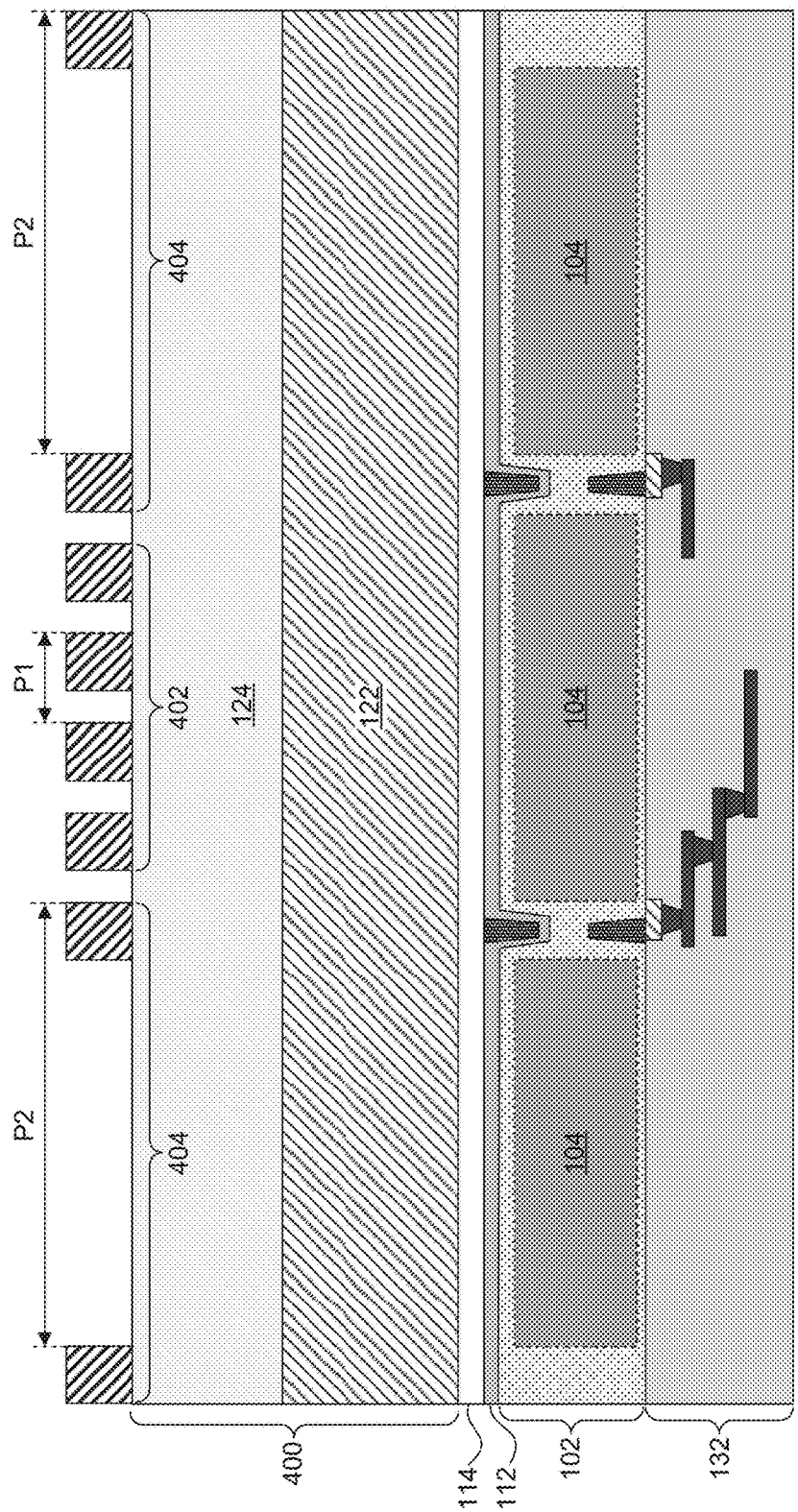
FIGS. 4-6 are cross-sectional views of a partially fabricated backside illuminated image sensor device during formation of a polarization grating structure, according to some embodiments.

In referring to FIG. 3, method 300 begins with operation 302, where a layer stack is formed over a semiconductor layer. In some examples, the layer stack can include more than 2 layers. FIG. 4 shows a partially fabricated image sensor, such as back side illuminated image sensor device 100 of FIG. 1, according to method 300. In FIG. 4, and according to operation 302, a layer stack 400, which includes bottom layer 122 and top dielectric layer 124, is formed over semiconductor layer 102. As discussed above, bottom layer 122 can include titanium, tungsten, aluminum, or copper. However, bottom layer 122 is not limited to metals and can include other suitable materials or stack of materials that can reflect and guide incoming visible light towards radiation-sensing areas 104 of semiconductor layer 102. By way of example and not limitation, bottom layer 122 can be formed using a sputtering process, a plating process, an evaporation process, a chemical vapor deposition (CVD) process, an atomic layer deposition (ALD) process, or any suitable deposition method. Further, the thickness of bottom layer 122 can range from about 100 Å to about 3000 Å (e.g., from 100 Å to 3000 Å). Bottom layer 122 is not deposited directly on semiconductor layer 102. According to some embodiments, bottom layer 122 is deposited over capping layer 114. In some embodiments, bottom layer 122 may be deposited on an adhesion/barrier layer disposed between bottom layer 122 and capping layer 114. For simplicity, the adhesion/barrier layer is not shown in FIG. 4.

According to operation 302, and referring to FIG. 4, top dielectric layer 124 of layer stack 400 can be deposited over bottom layer 122. In some embodiments, top dielectric layer 124 can be a stack of one or more dielectric layers. In some embodiments, top dielectric layer 124 allows incoming visible light to pass through. In other words, top dielectric layer 124 is made of a transparent material, or materials, that function as an anti-reflective material. In some embodiments, top dielectric layer 124 is made of $SiO_2$, $Si_3N_4$, SiON, SiC, a polymer, or other suitable transparent dielectric material(s). Top dielectric layer 124 can be deposited by CVD or ALD and have an as-deposited thickness that ranges from about 1000 Å to about 3000 Å (e.g., from 1000 Å to 3000 Å). Alternatively, top dielectric layer 124 can be spin-coated on bottom layer 122.

In referring to FIG. 3, method 300 continues with operation 304 and the formation of one or more polarization grating structures with grating elements therein within a composite grid structure, such as composite grid structure 116. In some embodiments, the formation of the one or more polarization grating structures is performed concurrently with the formation of the composite grid structure, such as composited grid structure 116. For example, referring to FIG. 4, a photoresist (PR) layer or a hard mask (HM) layer can be deposited over layer stack 400. The PR or HM layer is subsequently patterned so that patterned structures 402 and 404 are formed over layer stack 400. Patterned structures 402 can have a pitch P1 that ranges from about 100 nm to about 500 nm (e.g., from 100 nm to 500 nm) and can be used to form the grating elements of the polarization grating structures. The range of pitch P1 ensures that the width of each grating element can range from about 20 nm to about 300 nm (e.g., from 20 nm to 300 nm), as discussed above. Patterned structures 404 can have a pitch P2 greater than pitch P1 (e.g., P2>P1) and can be used to form the sidewalls of cells 118 of composite grid structure 116. By way of example and not limitation, four patterned structures 402 and 404 respectively are shown in FIG. 4. However, additional patterned structures 402 and 404 are possible across layer stack 400, according to some embodiments. Further, patterned structures 402, which are responsible for the formation of the grating elements of polarization grating structures, can be formed with their length at an angle with respect to patterned structures 404, which are responsible for the formation of cells 118 in composite grid structure 116. In some embodiments, the angle between patterned structures 402 and 404 coincides with a polarization angle of visible light. In some embodiments, the polarization angle can range from 0° to 135° in increments of 45°.

For example purposes, formation of grating elements will be described with patterned structures 402 being parallel to patterned structures 404 (e.g., resulting in grating elements with a polarization angle of 0°). Based on the disclosure herein, other orientation angles, as discussed above, can be implemented. These orientation angles are within the spirit and scope of this disclosure.

Figure 5:
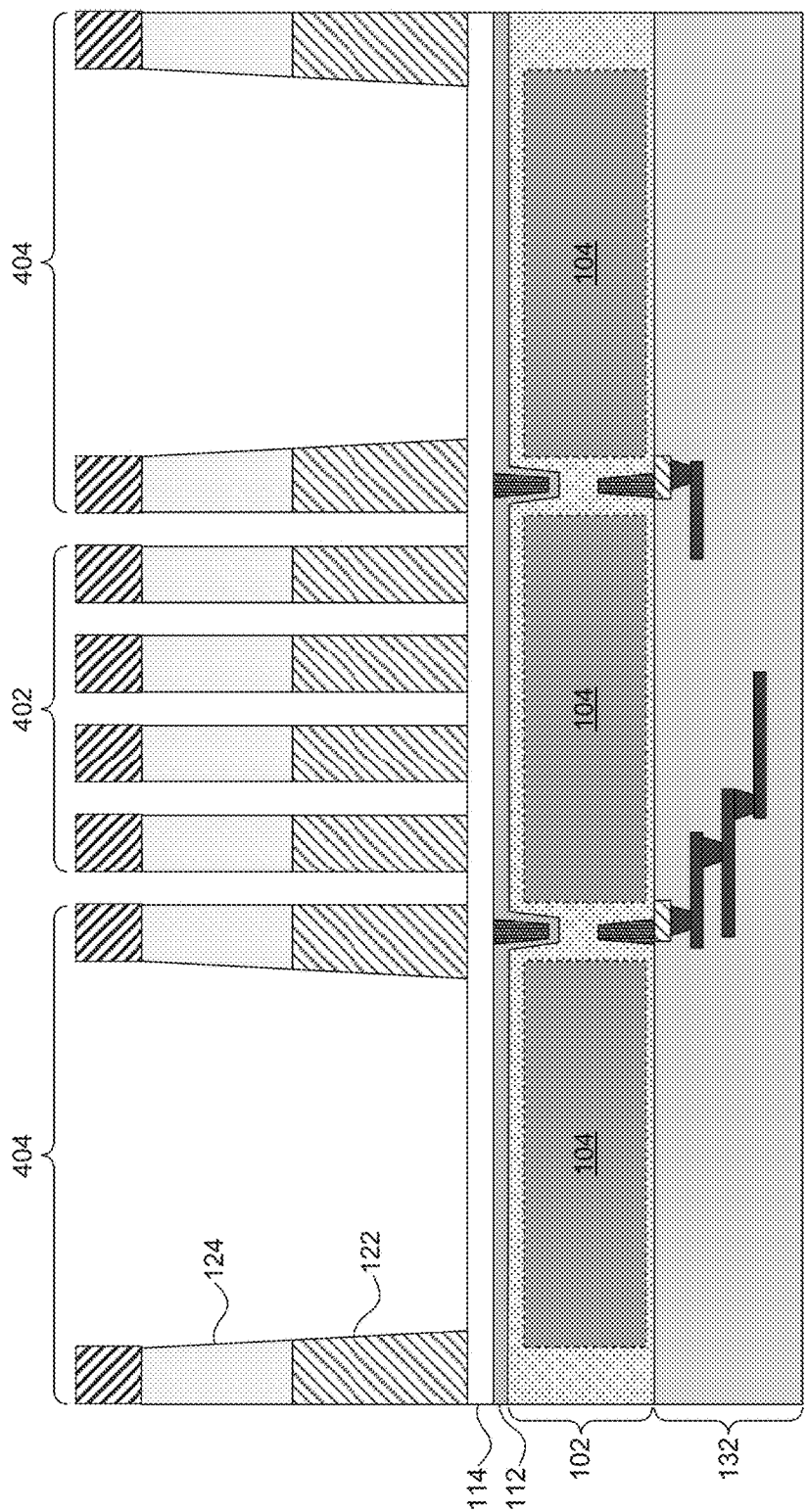

Patterned structures 402 and 404 are used as a mask layer so that a subsequent etch process can selectively remove layer stack 400 between patterned structures 402 and 404 to form composite grid structure 116. In some embodiments, the etch process can use a different etch chemistry for top dielectric layer 124 and bottom layer 122. In some embodiments, the etch process is end pointed; for example, it can be automatically terminated when capping layer 114 is exposed. Additionally, the etch process can be timed or can be a combination of timed and end-pointed etch processes. In some examples, the etch process is anisotropic so that the etched features have nominally vertical sidewalls. Further the etch process can have high selectivity towards top dielectric layer 124 and bottom layer 122. FIG. 5 is an example structure of FIG. 4 after the etch process of operation 304 described above.

Figure 6:
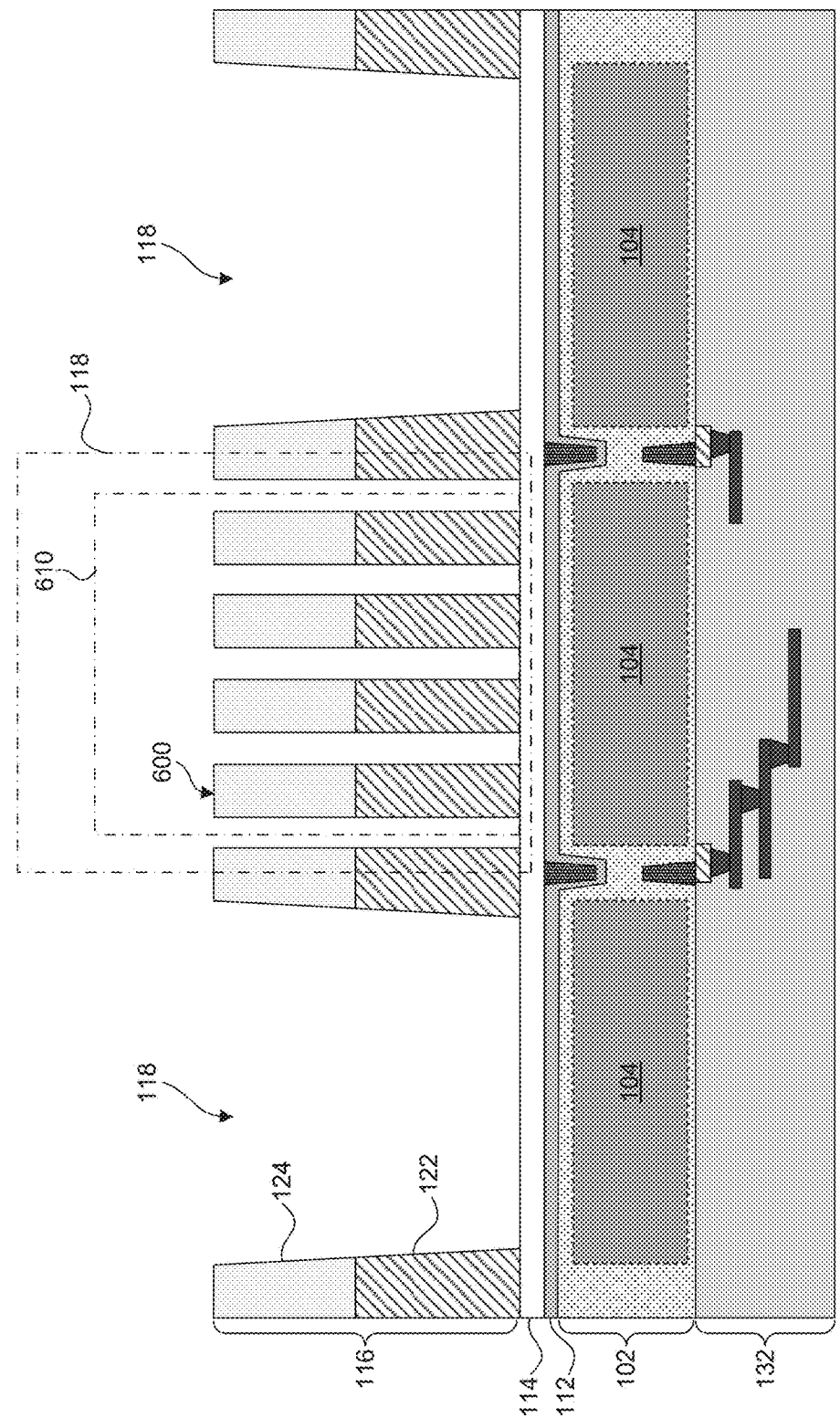
Figure 7A:
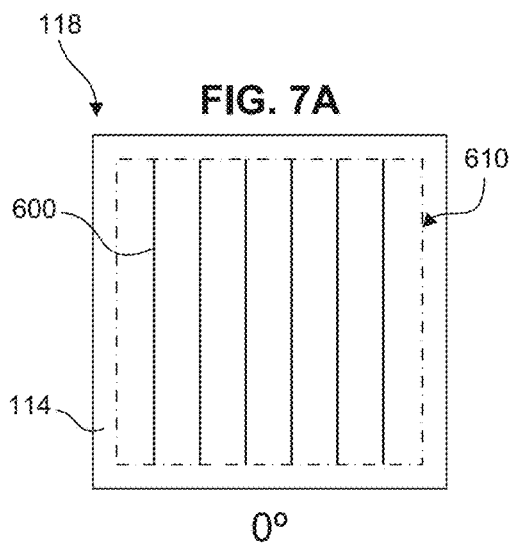
FIGS. 7A-D are top views of polarization grating structures with grating elements oriented in different polarization angles, according to some embodiments.
Figure 7B:
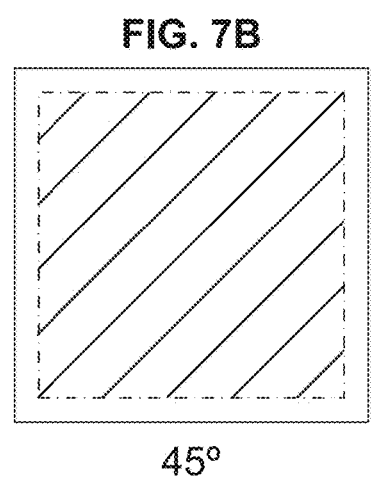
Figure 7C:
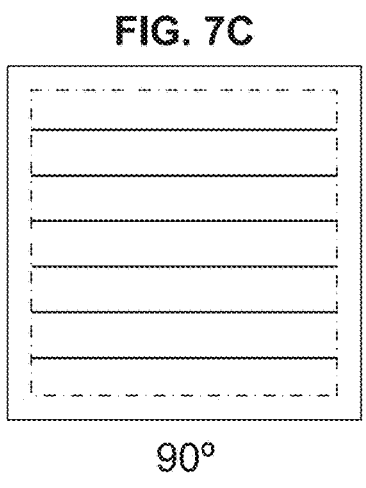
Figure 7D:
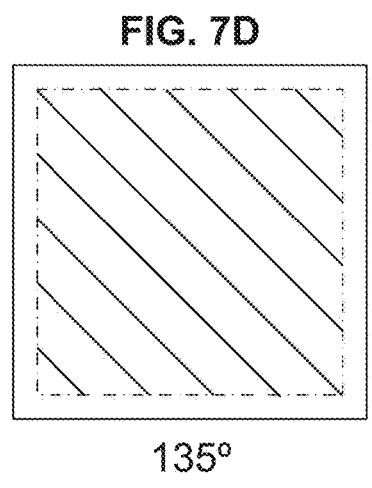

Once the etch process is complete, patterned structures 402 and 404 can be removed with a wet etch chemistry. The resulting etched structures—e.g., grating elements 600 and the sidewalls of cells 118—are shown in FIG. 6. In some embodiments, the height of grating elements 600 is between about 200 nm and about 1000 nm (e.g., from 200 nm to 1000 nm), their width is between about 20 nm and about 300 nm (e.g., from 20 nm to 300 nm), and their pitch is between about 100 nm to about 500 nm (e.g., from 100 nm to 500 nm). In the example of FIG. 6, grating elements 600 of polarization grating structure 610 are aligned parallel (e.g., at 0° polarization angle) to the sidewalls of cells 118 of composite grid structure 116—as shown for example in FIG. 7a, which is a top view of polarization grating structure 610 within a cell 118 at 0° polarization angle. According to FIG. 6, polarization grating structure 610 can be part of composite grid structure 116. In other words, polarization grating structure 610 can be formed in a cell 118 of composite grid structure 116. As discussed above, grating elements 600 can be aligned to different angles with respect to the sidewalls of cells 118 so that polarization grating structure 610 can detect light with additional polarization angles. By way of example and not limitation, FIGS. 7(a)-(d) are top views of exemplary polarization grating structures 610 with grating elements 600 oriented in different angles with respect to the sidewalls of cell 118 (e.g., 00, 45°, 90°, or 135°). As discussed above, these angles can coincide with respective polarization angles of incident light.

Further, cells 118 of composite grid structure 116 and polarization grating structure 610 are substantially aligned to radiation-sensing regions 104 of semiconductor layer 102. Further, additional polarization grating structures are possible across composite grid structure 116.

Figure 8:
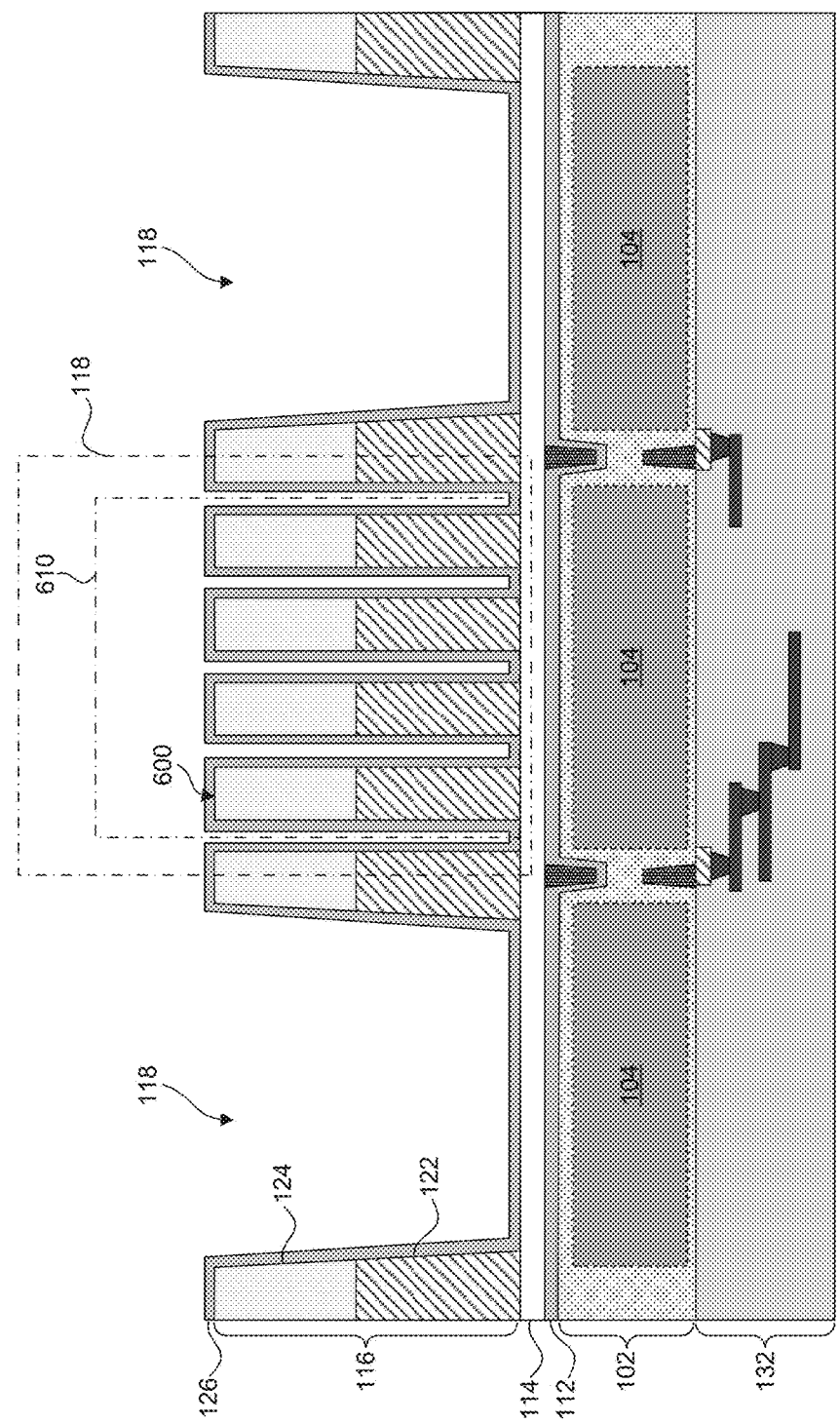
FIG. 8 is a cross-sectional view of a partially fabricated backside illuminated image sensor device after deposition of a passivation layer, according to some embodiments.

In referring to FIG. 8, after the formation of grating elements 600 and cells 118, passivation layer 126 is conformally deposited over the sidewalls of cells 118 and grating elements 600. By way of example and not limitation, passivation layer 126 can be deposited by a CVD-based or an ALD-based deposition method. Passivation layer 126 can be formed from a dielectric material, such as $SiO_2$, $Si_3N_4$, or SiON and can have a thickness between about 50 Å to about 3000 Å (e.g., from 50 Å to 3000 Å).

Referring to FIG. 3, method 300 continues with operation 306 where a gap between grating elements 600 of polarization grating structure 610 is filled with a color filter, air, a dielectric material, or a combination thereof. In some embodiments, the dielectric material is a transparent/anti-reflective material made of $SiO_2$, $Si_3N_4$, SiON, SiC, or a polymer.

Figure 9:
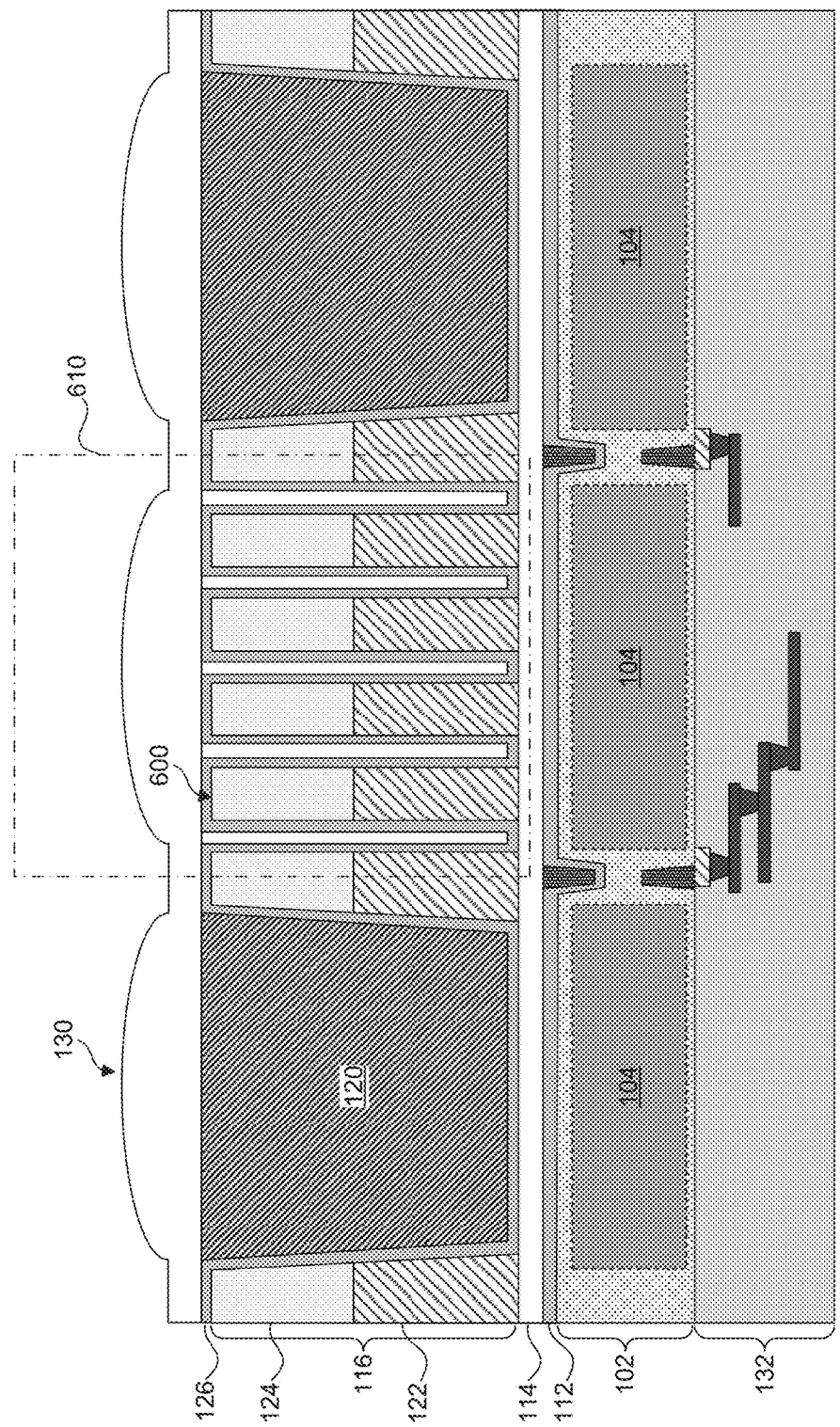
FIG. 9 is a cross-sectional view of a backside illuminated image sensor device with a polarization grating structure, according to some embodiment.
Figure 10:
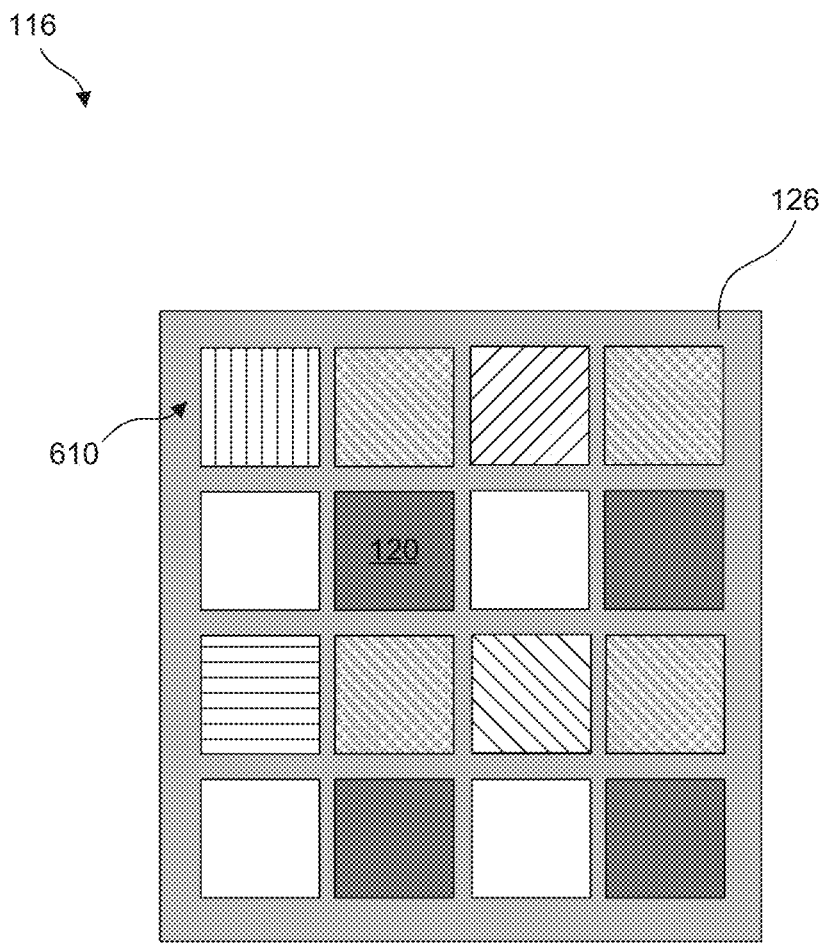
FIGS. 10-13 are top views of composite grid structures with polarization grating structures in different arrangements, according to some embodiments.
Figure 11:
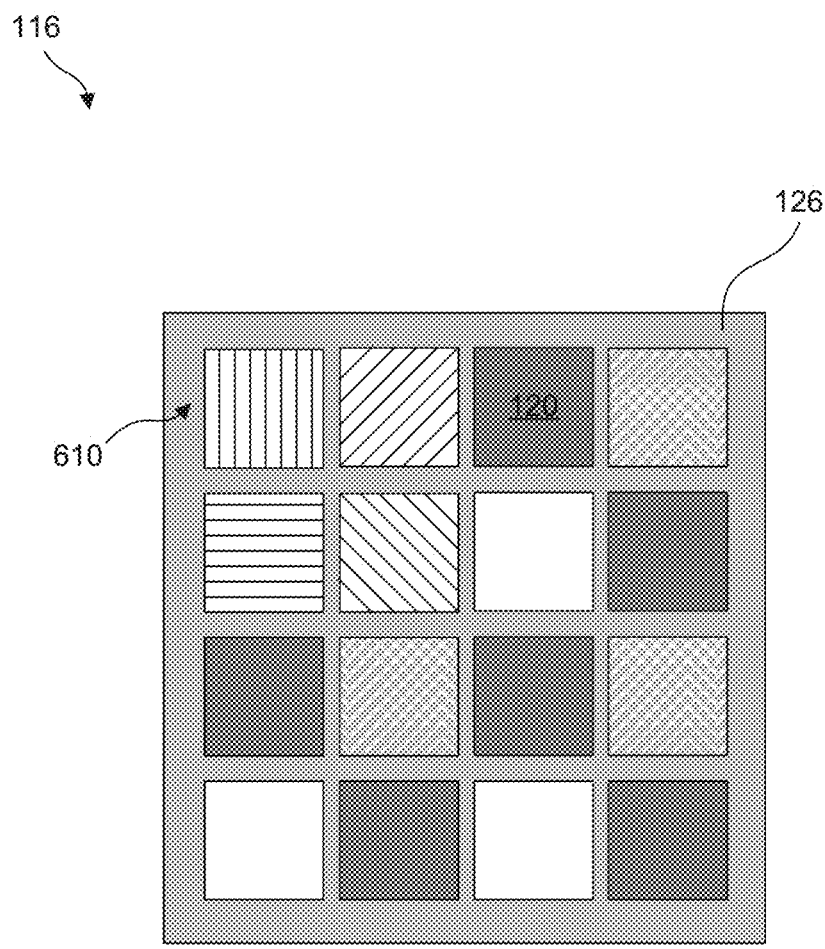
Figure 12:
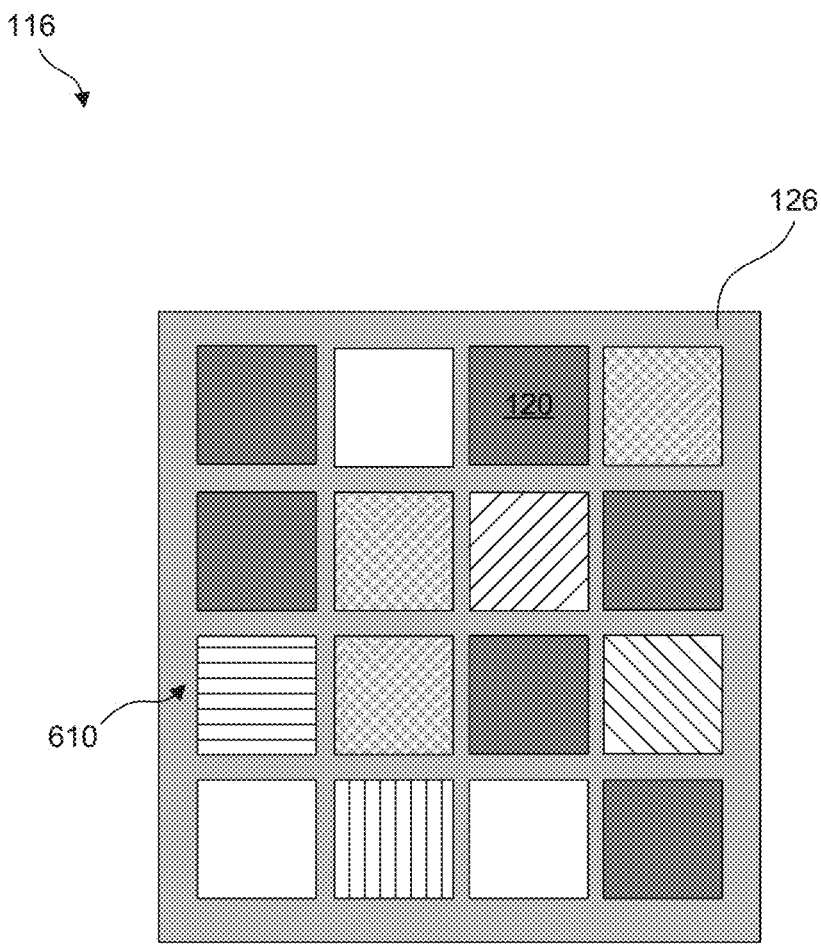
Figure 13:
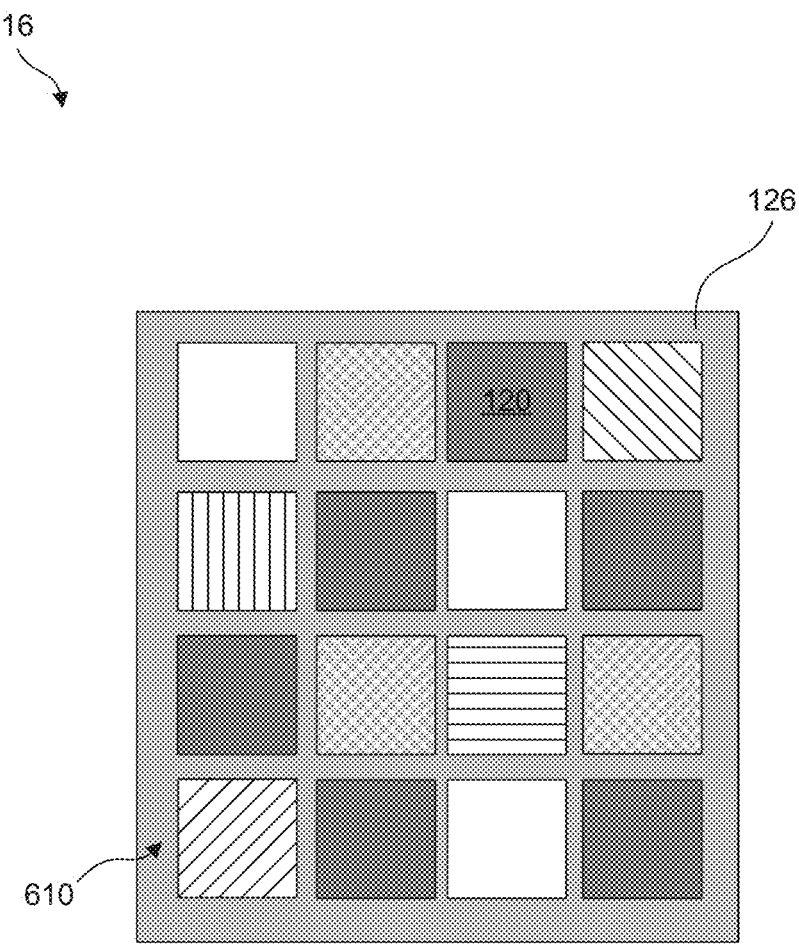

In operation 308, cells 118 of composite grid structure 116 are filled with one or more color filters 120, as shown in FIG. 9. In some embodiments, color filters 120 can be red, green, or blue. In the example of FIG. 9, the gap between grating elements 600 is filled with air. FIGS. 10 through 13 show exemplary arrangements of color filters 120 and polarization grid structures 610—with different polarization angles—in composite grid structure 116, according to some embodiments. The examples of FIGS. 10-13 are not limiting and additional arrangements are possible and within the spirit and the scope of this disclosure. For example, in a Bayern pattern—where the composite grid structure 116 can include 50% green color filters, 25% red color filters, and 25% blue color filters—some of the green color filters can be replaced by polarization grating structures.

In referring to FIG. 9, a micro-lens 130 can be formed over each cell 118 and polarization grating structure 610. Micro-lens 130 focuses the incoming light rays into respective cells 118 of composite grid structure 116 towards radiation-sensing regions 104 of semiconductor layer 102.

The present disclosure is directed to a method that describes the formation of a polarization grating structure (e.g., polarizer) as part of a composite grid structure of a back side illuminated image sensor device. In some embodiments, the polarization grating structure can be integrated into the composite grid structure by replacing one or more color filters of the composite grid structure with the polarizing grating structure (grid polarizer). In some embodiments, the polarizing grating structure can provide polarization information of the incident light along the following polarization directions: 0°, 45°, 90°, and/or 135°. The aforementioned polarization directions are not limiting and other polarization directions are possible. According to some embodiments, the pitch between grating elements of polarizing grating structure can range from about 100 nm to about 500 nm (e.g., from 100 nm to 500 nm), and the width of each grating element can range from about 20 nm to about 300 nm (e.g., from 20 nm to 300 nm). The grating elements of the polarizing grating structure can be made of the same material as the composite grid structure. Integration of the polarizers into the composite grid structure of a sensor device can offer several benefits, including: compact design for the image sensor, absence of moving parts, and faster acquisition of light polarization information (e.g., polarization information for all polarization angles is collected simultaneously).

In some embodiments a semiconductor image sensor device includes a semiconductor layer with one or more sensing regions configured to sense radiation; a grid structure, over the semiconductor layer, with one or more cells respectively aligned to the one or more sensing regions; and a polarizing grating in the one or more cells of the grid structure configured to polarize the light incoming to the semiconductor image sensor device.

In some embodiments a semiconductor image sensor includes one or more polarizing grating structures with grating elements aligned to a light polarization angle, where the one or more polarization grating structures are disposed in cells defined by a grid structure; a semiconductor layer with sensing regions configured to sense radiation entering the semiconductor layer from the grid structure, where the semiconductor layer is disposed below the grid structure so that each of the cells of the grid structure is aligned to a sensing region of the semiconductor layer; and a micro-lens over each cell of the grid structure.

In some embodiments a method to form an image sensor includes depositing a layer stack over a semiconductor layer with radiation-sensing regions, where the layer stack includes a bottom layer and a top anti-reflective layer. The method further includes, patterning the layer stack to form a grid structure with cells and a polarization grating structure within a cell, where the polarization grating structure comprises grating elements oriented to a light polarization angle. The method also includes filling the grating structure between the grating elements with air or a dielectric material and filling the cells that do not contain a polarization grating structure with a color filter.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor image sensor device, comprising:
   a semiconductor layer comprising one or more sensing regions configured to sense radiation;
   a grid structure, over the semiconductor layer, that comprises one or more cells respectively aligned to the one or more sensing regions; and
   a polarizing grating structure in the one or more cells of the grid structure, wherein the polarizing grating structure is configured to polarize light incoming to the semiconductor image sensor device and comprises grating elements with an anti-reflective layer disposed on a metal layer.

2. The semiconductor image sensor device of claim 1, wherein a polarization angle of the polarizing grating structure includes 0°, 45°, 90°, or 135°.

3. The semiconductor image sensor device of claim 1, wherein the polarizing grating structure comprises grating elements with a pitch between about 100 nanometers (nm) and about 500 nm.

4. The semiconductor image sensor device of claim 1, wherein the polarizing grating structure comprises grating elements with a height between about 200 nm and about 1000 nm.

5. The semiconductor image sensor device of claim 1, wherein the polarizing grating structure comprises grating elements with a width between about 20 nm and about 300 nm.

6. The semiconductor image sensor device of claim 1, wherein the polarizing grating structure comprises air or a dielectric material transparent to light.

7. The semiconductor image sensor device of claim 1, wherein the metal layer comprises tungsten, titanium, aluminum, or copper, and the anti-reflective layer comprises silicon oxynitride, silicon nitride, silicon carbide, silicon oxide, or a polymer.

8. The semiconductor image sensor device of claim 1, further comprising:
   a color filter disposed into the one or more cells,
   a micro-lens over each of the one or more cells; and
   an interconnect structure, below the semiconductor layer, configured to provide electrical connections to the one or more sensing regions of the semiconductor layer.

9. A semiconductor image sensor, comprising:
   one or more polarizing grating structures comprising grating elements aligned to a light polarization angle, wherein the one or more polarization grating structures are disposed in cells defined by a grid structure and each of the one or more polarization grating structures comprises a first material disposed on a second material different from the first material;
   a semiconductor layer with sensing regions configured to sense radiation entering the semiconductor layer from the grid structure, wherein the semiconductor layer is disposed below the grid structure so that each of the cells of the grid structure is aligned to a sensing region of the semiconductor layer; and
   a micro-lens over each cell of the grid structure.

10. The semiconductor image sensor of claim 9, wherein the one or more polarizing grating structures are arranged in adjacent cells in the grid structure.

11. The semiconductor image sensor of claim 9, wherein two or more polarizing grating structures are arranged in non-adjacent cells in the grid structure.

12. The semiconductor image sensor of claim 9, wherein the one or more polarizing grating structures occupy any cell in the grid structure.

13. The semiconductor image sensor of claim 9, wherein a sensing region under a polarizing grating structure is configured to receive polarized light with a polarization angle consistent with the light polarization angle of the grating elements in the one or more polarizing grating structures.

14. The semiconductor image sensor of claim 9, wherein each of the one or more polarizing grating structures is disposed between a micro-lens and a sensing region of the semiconductor layer.

15. The semiconductor image sensor of claim 9, further comprising an interconnect structure disposed on a side of the semiconductor layer opposite to the grid structure.

16. A method to form an image sensor, the method comprising:
   depositing a layer stack over a semiconductor layer with radiation-sensing regions, wherein the layer stack comprises a bottom metal layer and a top anti-reflective layer;
   patterning the layer stack to form:
      a grid structure comprising cells; and
      a polarization grating structure within a cell, wherein the polarization grating structure comprises grating elements oriented to a light polarization angle; and
   filling the grating structure between the grating elements with air or a dielectric material; and
   filling the cells that do not contain a polarization grating structure with a color filter.

17. The method of claim 16 further comprising:
   forming a micro-lens over each cell of the grid structure.

18. The method of claim 16, wherein patterning the layer stack comprises:

disposing a photoresist layer or a hard mask layer over the layer stack;

patterning the photoresist layer or the hard mask layer to form first patterned structures and second patterned structures, wherein the first patterned structures have a different pitch than the second patterned structures;

etching the layer stack through the first patterned structures to form the cells of the grid structure; and etching the layer stack through the second patterned structures to form the grating elements of the polarization grating structure.

19. The method of claim 16, wherein the grating elements have a pitch between 100 nm and 500 nm and a height between 200 nm and 1000 nm.

20. The method of claim 16, wherein incoming light to the image sensor is polarized according to the light polarization angle of the grating elements in the polarization grating structure.

* * * * *